(12) United States Patent
Hwang et al.

(10) Patent No.: US 9,035,198 B2
(45) Date of Patent: May 19, 2015

(54) TRANSPARENT CONDUCTIVE SUBSTRATE AND METHOD FOR MANUFACTURING SAME

(71) Applicant: LG CHEM, LTD., Seoul (KR)

(72) Inventors: Ji Young Hwang, Daejeon (KR); Hyeon Choi, Daejeon (KR); Seung Heon Lee, Daejeon (KR); Sujin Kim, Daejeon (KR); Ki-Hwan Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/973,609

(22) Filed: Aug. 22, 2013

(65) Prior Publication Data

US 2013/0341079 A1    Dec. 26, 2013

Related U.S. Application Data

(63) Continuation of application No. PCT/KR2012/007801, filed on Sep. 27, 2012.

(30) Foreign Application Priority Data

Sep. 27, 2011   (KR) .................. 10-2011-0097754

(51) Int. Cl.
| | |
|---|---|
| *H05K 1/00* | (2006.01) |
| *H05K 1/11* | (2006.01) |
| *G02B 5/18* | (2006.01) |
| *H05K 3/10* | (2006.01) |
| *G06F 3/044* | (2006.01) |
| *H05K 9/00* | (2006.01) |

(52) U.S. Cl.
CPC ............. *H05K 1/11* (2013.01); *Y10T 29/49155* (2013.01); *G02B 5/1866* (2013.01); *H05K 3/10* (2013.01); *G06F 3/044* (2013.01); *G06F 2203/04112* (2013.01); *H05K 9/0096* (2013.01)

(58) Field of Classification Search
USPC .......................... 174/268, 250, 251, 255–257
See application file for complete search history.

(56) References Cited

U.S. PATENT DOCUMENTS 7,656,357 B2 *    2/2010   Ishibashi et al. .............. 343/713

FOREIGN PATENT DOCUMENTS

| JP | 11-218766 | 8/1999 |
|---|---|---|
| JP | 2002-014772 | 1/2002 |
| JP | 2011059771 A | 3/2011 |
| JP | 2012-094115 | 5/2012 |

* cited by examiner

*Primary Examiner* — Tremesha S Willis
(74) *Attorney, Agent, or Firm* — McKenna Long & Aldridge, LLP

(57) ABSTRACT

The present invention provides a transparent conductive substrate comprising: a transparent substrate, and a conductive pattern provided on the transparent substrate, wherein the conductive pattern comprises line breakage portions performing electric breakage, and a pattern of a broken line formed when the line breakage portions are connected comprises an irregular pattern shape. The present invention can minimize a moiré phenomenon and a diffraction phenomenon by external light by performing line breakage of a regular or irregular conductive pattern by using the irregular pattern.

13 Claims, 6 Drawing Sheets

TRANSPARENT CONDUCTIVE SUBSTRATE AND METHOD FOR MANUFACTURING SAME

This application is a Continuation Bypass of International Application No. PCT/KR2012/007801, filed Sep. 27, 2012, and claims priority to and the benefit of Korean Patent Application No. 10-2011-0097754, filed Sep. 27, 2011, the disclosures of which are incorporated herein by reference in their entirety.

TECHNICAL FIELD

The present invention relates to a transparent conductive substrate comprising a transparent conductive pattern, which can control occurrence of a moiré phenomenon and a diffraction pattern, and a method of manufacturing the same.

BACKGROUND ART

In general, a display device refers to monitors for a TV or a computer as a whole, and comprises a display device forming an image and a case supporting the display device.

Examples of the display device may comprise a plasma display panel (PDP), a liquid crystal display (LCD), an electrophoretic display, and a cathode-ray tube (CRT). An RGB pixel pattern for implementing an image and an additional optical filter may be provided in the display device.

The optical filter may comprise at least one of a reflection prevention film preventing the light that is incident from the outside from being reflected to the outside, a near IR shield film shielding the near IR generated in the display device in order to prevent mis-operation of electronic devices such as remote controllers, a color correction film increasing the color purity by controlling a color tone by comprising a color control dye, and an electromagnetic wave shield film shielding the electromagnetic wave generated in a display device when a display apparatus is driven. Here, the electromagnetic wave shield film comprises a transparent substrate and a metal mesh pattern provided on the substrate.

Meanwhile, with regard to the display apparatus, as the spread of IPTVs is accelerated, a demand for a touch function that uses hands as a direct input apparatus without a separate input apparatus such as remote controllers is growing. In addition, a multi-touch function for recognizing a specific point and taking notes is required.

The touch panel performing the aforementioned function may be classified into the following types according to the detection manner of a signal.

That is, examples thereof comprise a resistive type detecting a position pressed by pressure in a state where a direct voltage is applied while changing a current or voltage value, a capacitive type using capacitance coupling in a state where an alternating voltage is applied, an electromagnetic type detecting a selected position in a state where a magnetic field is applied as a change in voltage, and the like.

Among them, the resistive type and capacitive type touch panels that are most extensively spread recognize the touch by a change in electric contact or capacitance by using the transparent conductive film such as the ITO film. However, since the transparent conductive layer has high resistance of 100 ohms/square or more, the sensitivity is lowered when the display device is manufactured in a large scale, and as the size of screen is increased, the cost of the ITO film is rapidly increased, accordingly, it is not easy to perform commercialization thereof. In order to overcome this, there is an effort to implement enlargement by using a metal pattern having high conductivity.

As described above, in the case where the display apparatus comprises the electromagnetic wave shield film or touch panel comprising a metal pattern, there is a problem in that the electromagnetic wave shield film and the touch panel cause interference with a pixel pattern and an electrode pattern of the display or a pattern structure of another optical film, thus causing a moiré phenomenon. Herein, the moiré means an interference pattern formed when two or more regular patterns overlap.

As an example thereof, since the pixel pattern of the plasma display panel (PDP) and the metal mesh pattern for electromagnetic wave shielding of the optical filter coexist in the plasma display panel (PDP), a moiré phenomenon may occur. Therefore, in general, if the specification of the plasma display panel (PDP) is determined, an effort for solving the moiré phenomenon is performed through a design of the metal mesh pattern of the optical filter.

As described above, the line width, the pitch, and the angle of the metal mesh pattern for the electromagnetic wave shielding are controlled in order to remove the moiré, but there is a problem in that it is necessary to correspond to different patterns according to the size of the display and the pixel implementation method.

In particular, the recently developed plasma display panel comprises a more precise pixel pattern in order to implement a high resolution, thus increasing the possibility of the moiré. Accordingly, there is a limit in improving the moiré by only controlling the line width, the pitch, and the angle of the known pattern.

DISCLOSURE

Technical Problem

Therefore, the present invention has been made in an effort to provide a conductive substrate comprising a conductive pattern, which does not block a viewing angle, has excellent conductivity, and can prevent a moiré phenomenon and a diffraction pattern, and a method of manufacturing the same.

Technical Solution

An exemplary embodiment of the present invention provides a transparent conductive substrate comprising: a transparent substrate, and a conductive pattern provided on the transparent substrate, wherein the conductive pattern comprises line breakage portions performing electric breakage, and a pattern of a broken line formed when the line breakage portions are connected comprises an irregular pattern shape.

Another exemplary embodiment of the present invention provides a method of manufacturing a transparent conductive substrate, comprising: forming a conductive pattern on a transparent substrate, wherein the conductive pattern comprises line breakage portions performing electric breakage, and a pattern of a broken line formed when the line breakage portions are connected is formed to comprise an irregular pattern shape.

Yet another exemplary embodiment of the present invention provides a capacitive type touch screen apparatus comprising: the transparent conductive substrate.

Advantageous Effects

The present invention relates to a transparent conductive substrate comprising a conductive pattern and a method of manufacturing the same, and a moiré phenomenon and a diffraction phenomenon by external light can be minimized by performing line breakage of a regular or irregular conductive pattern by using the irregular pattern.

BEST MODE

Figure 1:
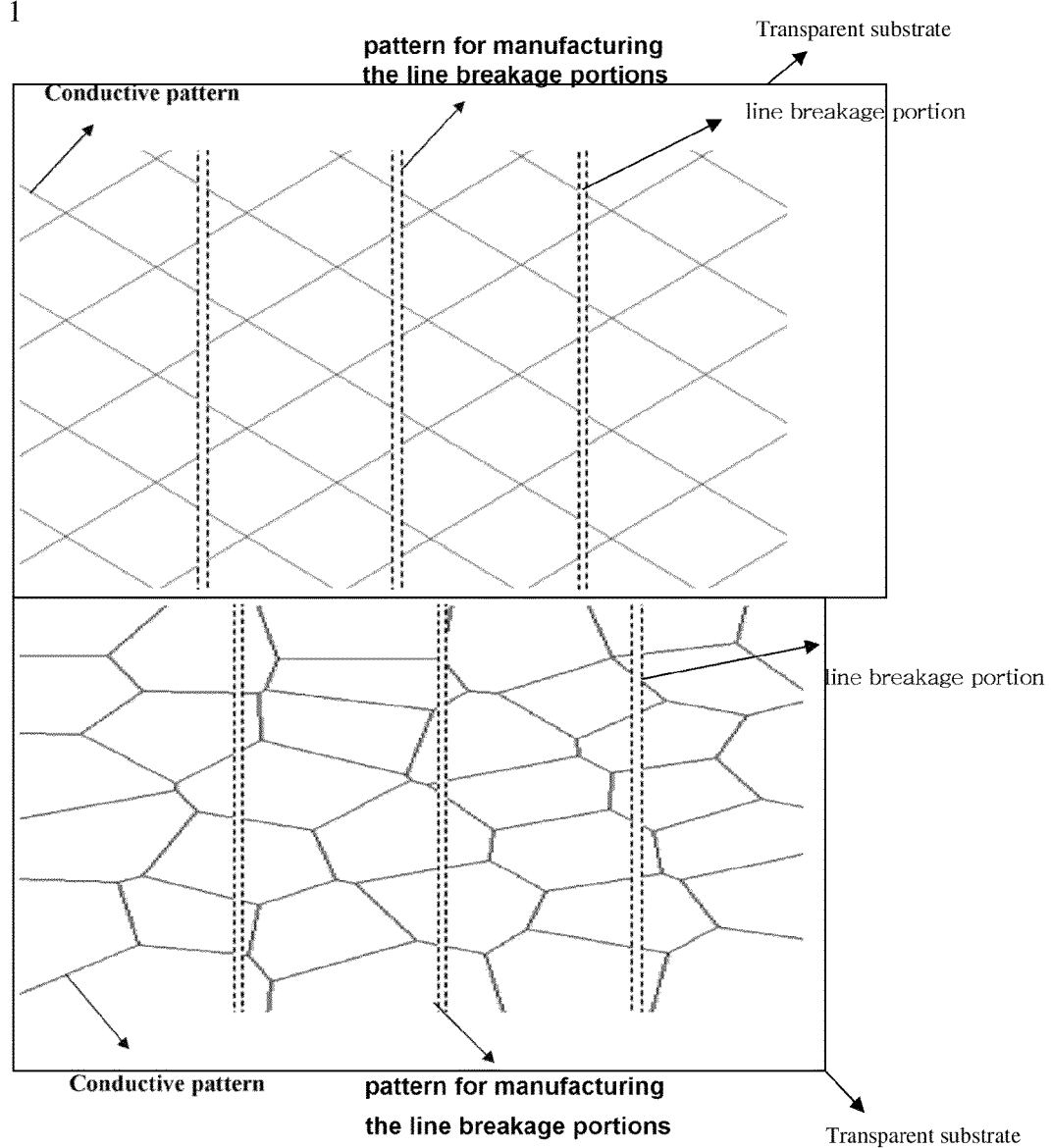
FIG. 1 is a view showing an exemplary embodiment of a known line pattern a broken line.

Hereinafter, the present invention will be described in detail.

The present invention provides a transparent conductive substrate comprising: a transparent substrate, and a conductive pattern provided on the transparent substrate, wherein the conductive pattern comprises line breakage portions performing electric breakage, and a pattern of a broken line formed when the line breakage portions are connected comprises an irregular pattern shape.

In the transparent conductive substrate according to the present invention, the conductive pattern may comprise the pattern formed of the conductive metal line. Herein, the pattern formed of the conductive metal line may comprise a straight line, a curved line, a closed curve formed of the straight line and the curved line.

The conductive pattern may be a regular pattern or an irregular pattern.

A pattern shape of the art, such as a mesh pattern, may be used as the regular pattern. The mesh pattern may comprise a regular polygonal pattern comprising one or more shapes of a triangle, a quadrangle, a pentagon, a hexagon, and an octagon.

In the exemplary embodiment of the present invention, the conductive pattern is a regular pattern and comprises cross points formed by crossing a plurality of predetermined lines among lines constituting the conductive pattern, and in this case, the number of cross points may be 3,000 to 122,500, 13,611 to 30,625, and 19,600 to 30,625 in an area of 3.5 cm×3.5 cm. Further, according to the exemplary embodiment of the present invention, when the pattern is provided in the display, it is confirmed that the optical property of the display is not largely spoiled in the case where the number of cross points is 4,000 to 123,000.

Further, in the exemplary embodiment of the present invention, the conductive pattern is the irregular pattern and comprises cross points formed by crossing a plurality of predetermined lines among the lines constituting the conductive pattern, and in this case, the number of cross points may be 6,000 to 245,000, 3,000 to 122,500, 13,611 to 30,625, and 19,600 to 30,625 in an area of 3.5 cm×3.5 cm. Further, according to the exemplary embodiment of the present invention, when the pattern is provided in the display, it is confirmed that the optical property of the display is not largely spoiled in the case where the number of cross points is 4,000 to 123,000.

The pitch of the conductive pattern may be 600 μm or less and 250 μm or less, but the pitch may be adjusted according to transmittance and conductivity required by the person with ordinary skill in the art.

The conductive pattern used in the present invention is appropriately a material having specific resistance of $1 \times 10^6$ to $30 \times 10^6$ ohm·cm, and more preferably $7 \times 10^6$ ohm·cm or less.

In the present invention, the conductive pattern may be the irregular pattern.

The irregular pattern comprises an edge structure of continuously connected closed figures, the closed figures having the same shape are not present in a predetermined irregular unit area (1 cm×1 cm), and the number of vertexes of the closed figures may be different from the number of vertexes of the quadrangles having the same number as the closed figures. To be more specific, the number of vertexes of the closed figures may be larger than or 1.9 to 2.1 times larger than the number of vertexes of the quadrangles having the same number as the closed figures, but is not limited thereto.

The closed figures are continuously connected to each other, and for example, in the case where the closed figures are polygons, the adjacent closed figures may have a shape sharing at least one side.

The irregular pattern comprises the edge structure of continuously connected closed figures, the closed figures having the same shape are not present in a predetermined unit area (1 cm×1 cm) in the irregular pattern, and the number of vertexes of the closed figures may be different from the number of vertexes of the polygon formed by connecting shortest distances between centers of gravity of the closed figures. To be more specific, the number of vertexes of the closed figures may be larger than or 1.9 to 2.1 times larger than the number of vertexes of the polygons formed by connecting the shortest distances between centers of gravity of the closed figures, but is not limited thereto.

The irregular pattern comprises the edge structure of the continuously connected closed figures, the closed figures having the same shape are not present in the predetermined unit area (1 cm×1 cm) in the irregular pattern, and a value of the following Equation 1 may be 50 or more in the closed figures.

(Standard deviation of distances between vertexes/
Average of distances between vertexes)×100   [Equation 1]

The value of Equation 1 may be calculated in the unit area of the conductive pattern. The unit area may be an area where the conductive pattern is formed, and, for example, 3.5 cm×3.5 cm and the like, but is not limited thereto.

In the present invention, the vertex means a point at which the lines constituting the edge of the closed figures of the conductive pattern cross each other.

The irregular pattern may have a shape of the edge structure of the closed figures obtained by after disposing predetermined points in regularly arranged unit cells, connecting the points to the closest points thereto as compared to the distances from other points.

In this case, in the case where randomness is introduced into a manner where predetermined points are disposed in the regularly arranged unit cells, the irregular pattern may be formed. For example, in the case where randomness is provided as 0, if the unit cell is a square, the conductive pattern has a square mesh structure, and if the unit cell is a regular hexagon, the conductive pattern has a honeycomb structure. That is, the irregular pattern means a pattern where randomness is not 0.

A leaning phenomenon and the like of lines constituting the pattern may be suppressed, uniform transmittance may be obtained from the display, the linear density to the unit area may be maintained as the same value, and uniform conductivity may be ensured by the conductive pattern having the irregular pattern shape according to the present invention.

In the present invention, the material of the conductive pattern is not particularly limited, but is preferably metal. It is preferable that the material of the conductive pattern have excellent conductivity and be easily etched.

In the present invention, even though the material having the total reflectance of 70 to 80% or more is used, it is possible to decrease the total reflectance, decrease visibility of the electric conductive pattern, and maintain or improve a contrast property.

Specific examples of the material of the conductive pattern preferably comprise a single film or a multilayered film comprising gold, silver, aluminum, copper, neodymium, molybdenum, nickel, or an alloy thereof. Herein, the thickness of a first conductive pattern and a second conductive pattern is not particularly limited, but is preferably 0.01 to 10 µm in terms of the conductivity of the conductive pattern and the economic efficiency of the forming process thereof.

The forming of the conductive pattern may adopt a method using an etching resist pattern. The etching resist pattern may be formed by using a printing method, a photolithography method, a photography method, a method using a mask, or laser transferring, for example, thermal transfer imaging, and the printing method or photolithography method is more preferable. The electric conductive pattern may be etched by using the etching resist pattern, and the etching resist pattern may be removed.

In the present invention, the line width of the conductive pattern may be 10 µm or less, 7 µm or less, 5 µm or less, 4 µm or less, 2 µm or less, or 0.1 µm or more. To be more specific, the line width of the conductive pattern may be 0.1 to 1 µm, 1 to 2 µm, 2 to 4 µm, 4 to 5 µm, 5 to 7 µm, or the like, but is not limited thereto.

Further, the line width of the conductive pattern may be 10 µm or less and the thickness thereof may be 10 µm or less, the line width of the conductive pattern may be 7 µm or less and the thickness thereof may be 1 µm or less, or the line width of the conductive pattern may be 5 µm or less and the thickness thereof may be 0.5 µm or less.

To be more specific, in the present invention, the line width of the conductive pattern may be 10 µm or less, and in the conductive pattern, the number of vertexes of the closed figures in the area of 3.5 cm×3.5 cm may be 6,000 to 245,000. Further, the line width of the conductive pattern may be 7 µm or less, and in the conductive pattern, the number of vertexes of the closed figures in the area of 3.5 cm×3.5 cm may be 7,000 to 62,000. Further, the line width of the conductive pattern may be 5 µm or less, and in the conductive pattern, the number of vertexes of the closed figures in the area of 3.5 cm×3.5 cm may be 15,000 to 62,000.

The aperture ratio of the conductive pattern, that is, the ratio of the area not covered by the pattern, may be 70% or more, 85% or more, and 95% or more. In addition, the aperture ratio of the conductive pattern may be 90 to 99.9%, but is not limited thereto.

The conductive pattern used in the present invention is appropriately a material having specific resistance of $1 \times 10^6$ to $30 \times 10^6$ ohm·cm, and more preferably $7 \times 10^6$ ohm·cm or less.

Further, in the present invention, a transparent substrate may be additionally comprised in a surface from which the conductive pattern is visible.

In the present invention, in the case where the conductive material is formed on an entire surface thereof through deposition, a known photolithography method, offset printing method, screen printing method, inkjet printing method and the like may be used as a patterning method to pattern a mixture of an organic material or an organic/inorganic material having acidity resistance during an etching process. In this case, a method of appropriately implementing the corresponding line width by the person with ordinary skill in the art may be selected to be used.

Further, in the present invention, a direct printing method may be selected as the method of forming the conductive pattern to be used. In this case, the direct printing method means a method of directly printing a conductive material through gravure offset printing, screen printing, reverse offset printing, and inkjet printing as the method of forming the pattern by directly printing the conductive material. In this case, the shape of the conductive material may be a particle shape. In this case, particles formed of pure silver or copper and the like may be mainly used as the conductive pattern material, and copper particles coated with silver may be used.

In the present invention, in the case where ink or the paste comprising the conductive pattern material is used, ink or the paste may further comprise an organic binder in addition to the conductive pattern material as described above so as to easily perform the printing process. It is preferable that the organic binder have a volatile property in a sintering process. Examples of the organic binder comprise a novolac resin, a polyacryl-based resin, a polyurethane-based resin, a polyester-based resin, a polyolefine-based resin, a polycarbonate-based resin, a cellulose resin, a polyimide-based resin, a polyethylene naphthalate-based resin, a denatured epoxy resin, and the like, but are not limited thereto.

The ink or the paste may comprise an additional adhesion strength reinforcing agent in order to improve an adhesion strength) of the paste to the transparent substrate such as glass. In this case, the adhesion strength reinforcing agent may be an organic material, and in the case where the adhesion strength reinforcing agent is formed on glass, the adhesion strength reinforcing agent may be a glass frit.

In the present invention, the conductive pattern may be darkened. In general, in the case where metal is deposited, darkening may be performed during a deposition process, and in the case where the darkening is not performed during the deposition process, the darkening may be performed through an additional dry or wet process after patterning. In this case, examples of the dry darkening method may comprise a method of darkening a metal surface through a plasma gas, and in the wet darkening method, the surface may be darkened by dipping the metal surface in a darkening solution. In this case, in the case where the darkening region has conductivity by the person with ordinary skill in the art, a method according thereto may be selected, and in this case, the darkening during a deposition step may be advantageous as compared to another method.

Further, in the present invention, the darkening material may be added and used in ink or the paste during direct printing. In this case, metal oxides, carbon black, carbon nanotubes, black pigments, black dyes and the like may be used as the darkening material that may be added to the ink or the paste.

In the present invention, surface resistance of the conductive substrate may be 1 to 300 ohm/square. The matter within the aforementioned range is advantageous in operation of the touch screen.

In the present invention, a lateral surface of the conductive pattern may have a positive taper angle, but the conductive pattern positioned on an opposite surface of a substrate side of the conductive pattern may have a negative taper angle.

In the present invention, the pattern of the broken line means the pattern formed when the line breakage portions are connected.

Figure 2:
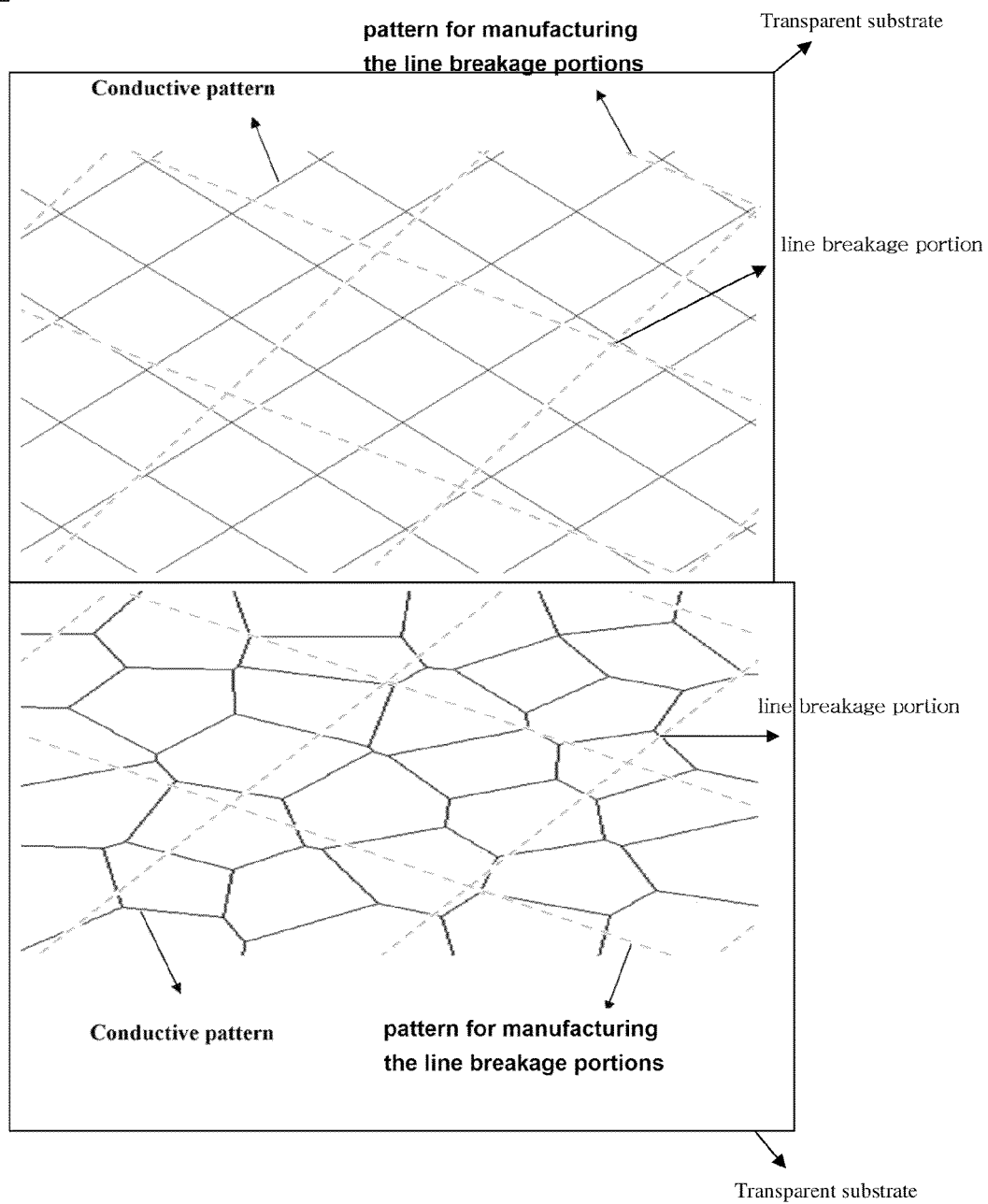
FIG. 2 is a view showing an exemplary embodiment of a known surface pattern of a broken line.

FIG. 1 is a view showing an exemplary embodiment of a known line pattern of a broken line, and FIG. 2 is a view showing an exemplary embodiment of a known surface pattern of a broken line. Since the known pattern of the broken line comprises only a regular pattern shape, there are problems in that a moiré phenomenon by the pattern of the broken line and a diffraction phenomenon by external light occur.

Figure 3:
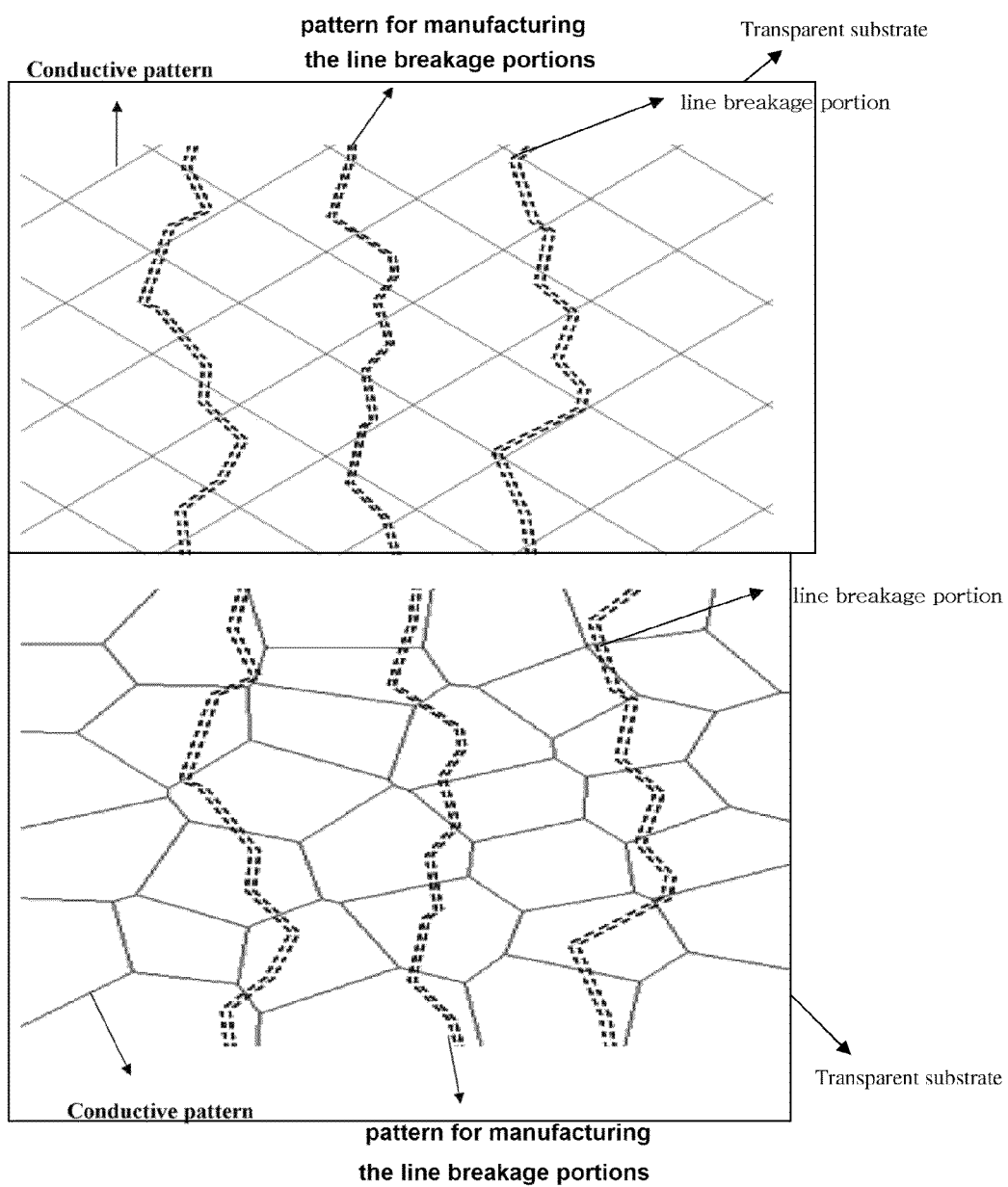
FIG. 3 is a view showing a line pattern of a broken line of an irregular line as the exemplary embodiment of the present invention.
Figure 4:
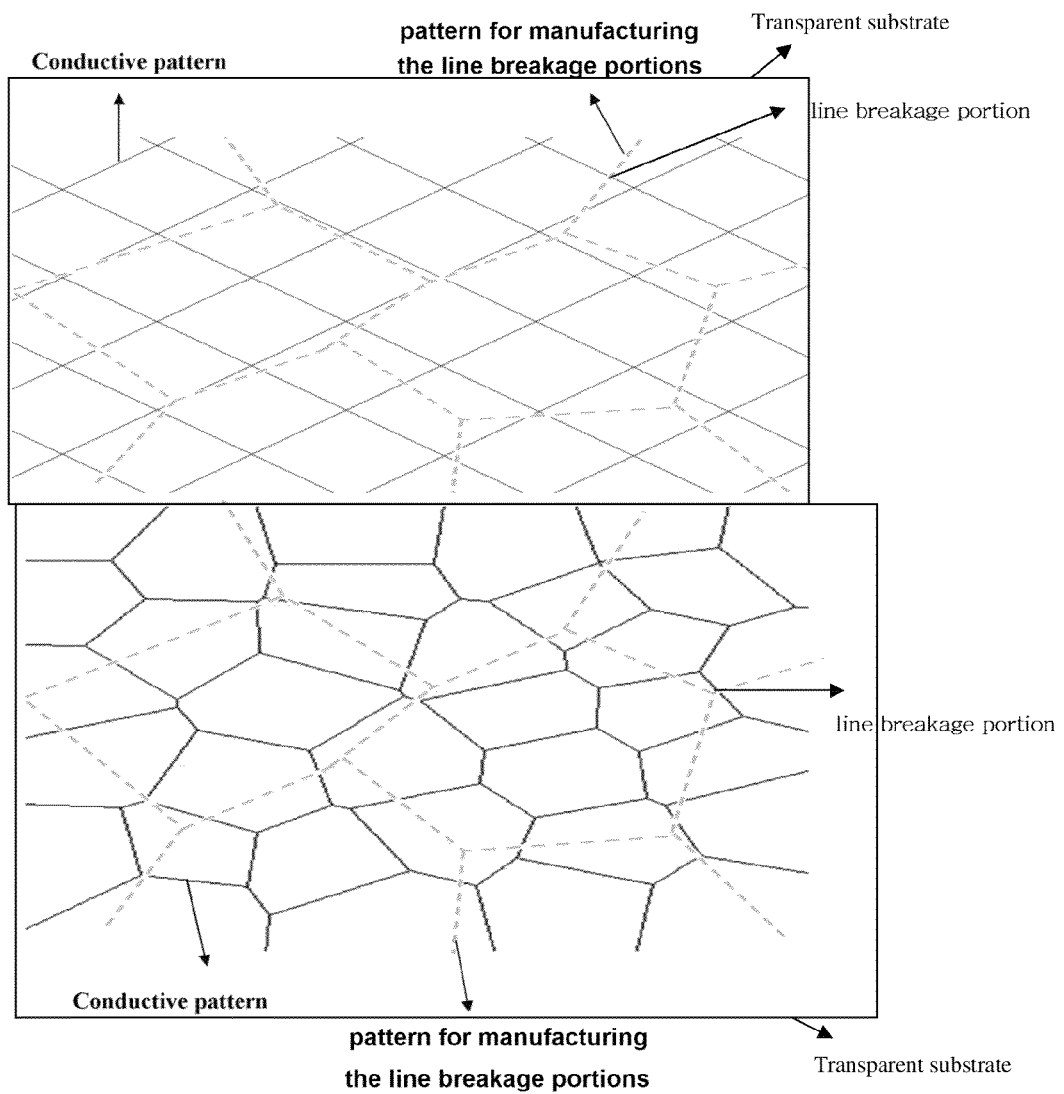
FIG. 4 is a view showing a line pattern of a broken line of an irregular surface as the exemplary embodiment of the present invention.

FIGS. 3 and 4 are views showing irregular line and surface patterns of broken lines as the exemplary embodiment of the present invention.

In the transparent conductive substrate according to the present invention, the pattern of the broken line formed when the line breakage portions are connected may further comprise a regular pattern shape. In this case, it is preferable that the shape of the regular pattern be less than 20% of the shape of the entire pattern of the broken line.

Further, the pattern of the broken line formed when the line breakage portions are connected may comprise an irregular pattern shape. Since the content of the shape of the irregular pattern of the broken line is the same as the shape of the aforementioned irregular conductive pattern, a specific description thereof will be omitted.

In the transparent conductive substrate according to the present invention, the conductive pattern may comprise the conductive metal line, and an interval between the conductive metal lines broken by the line breakage portion may be 50 µm or less. The interval between the conductive metal lines broken by the line breakage portion is more preferably 0.5 to 15 µm, but is not limited thereto.

In the present invention, the transparent conductive substrate comprising the conductive pattern can minimize the moiré phenomenon and the diffraction phenomenon by external light by performing line breakage of the regular or irregular conductive pattern by using the irregular pattern.

Figure 5:
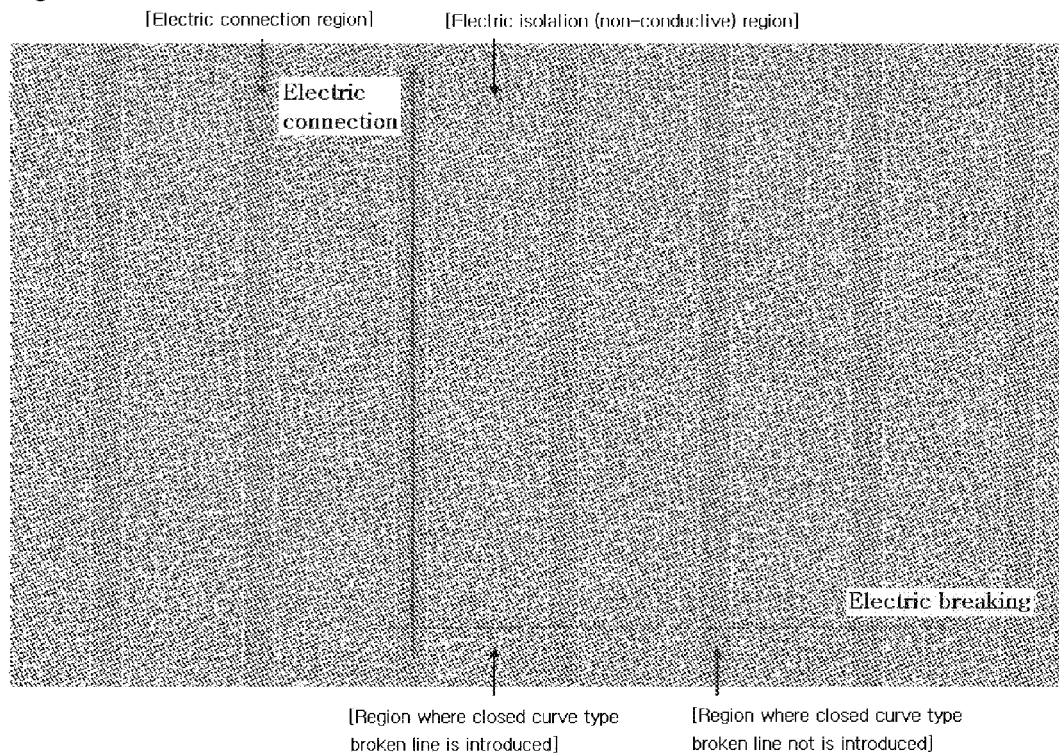
FIG. 5 is a view showing a conductive pattern comprising an irregular pattern of a broken line as the exemplary embodiment of the present invention.

The conductive pattern comprising the aforementioned irregular pattern of the broken line is shown in the following FIG. 5.

In the present invention, the transparent substrate is not particularly limited, but light transmittance is 50% or more, and preferably 75% or more. Specifically, glass may be used as the transparent substrate, and the plastic substrate or the plastic film may be used. A material known in the art may be used as the plastic substrate or film, and for example, a material formed of one or more resins selected from polyacryls, polyurethanes, polyesters, polyepoxys, polyolefines, polycarbonates, and celluloses may be used. To be more specific, it is preferable to use the film having visible ray transmittance of 80% or more, such as PET (polyethylene terephthalate), PVB (polyvinylbutyral), PEN (polyethylene naphthalate), PES (polyethersulfone), PC (polycarbonate), and acetyl celluloid. The thickness of the plastic film is preferably 12.5 to 500 µm, more preferably 50 to 450 µm, and even more preferably 50 to 250 µm. The plastic substrate may be a substrate having a structure in which various functional layers such as a gas barrier layer for blocking moisture and gas and a hard coat layer for compensating strength are laminated on one surface or both surfaces of the plastic film. The functional layer that can be comprised in the plastic substrate is not limited thereto, and various functional layers may be provided.

In the present invention, it is preferable to use metal having excellent electric conductivity as the material of the conductive pattern. In addition, the specific resistance value of the conductive pattern material is preferably 1 microOhm cm or more and 200 microOhm cm or less. Specific examples of the conductive pattern material may comprise copper, silver, gold, iron, nickel, aluminum, carbon nanotube (CNT), or the like, and silver is most preferable. The electric conductive pattern material may be used in a particle form. In the present invention, copper particles coated with silver may be used as the conductive pattern material.

In the present invention, in the case where the paste comprising the electric conductive pattern material is used, the paste may further comprise an organic binder in addition to the electric conductive pattern material as described above so as to easily perform the printing process. It is preferable that the organic binder have a volatile property in a sintering process. Examples of the organic binder comprise a polyacryl-based resin, a polyurethane-based resin, a polyester-based resin, a polyolefin-based resin, a polycarbonate-based resin, a cellulose resin, a polyimide-based resin, a polyethylene naphthalate-based resin, a denatured epoxy resin, and the like, but are not limited thereto.

The paste may further comprise a glass frit in order to improve adhesion strength of the paste to the transparent substrate such as glass. The glass frit may be selected from the commercial products, but the environmentally friendly glass fit without lead component may be used. In this case, the average diameter of the used glass frit may be 2 µm or less and the maximum diameter thereof may be 50 µm or less.

If necessary, a solvent may be further added to the paste. Examples of the solvent comprise butyl carbitol acetate, carbitol acetate, cyclohexanon, cellosolve acetate, terpineol, and the like, but are not limited thereto.

In the present invention, in the case where the paste comprising the conductive pattern material, the organic binder, the glass frit, and the solvent is used, it is preferable that the weight ratio of the electric conductive pattern material be 50 to 90%, the weight ratio of the organic binder be 1 to 20%, the weight ratio of the glass frit be 0.1 to 10%, and the weight ratio of the solvent be 1 to 20%.

According to the exemplary embodiment of the present invention, the conductive pattern may be blackened. If the paste comprising the metal material is sintered at high temperatures, metal gloss is shown, such that visibility may be lowered because of the reflection of light and the like. The aforementioned problem may be prevented by blackening the conductive pattern. In order to blacken the conductive pattern, the blackening material may be added to the paste for forming the electric conductive pattern or blackening treatment may be performed after the paste is printed and sintered, thereby blackening the conductive pattern.

Examples of the blackening material that may be added to the paste comprise metal oxide, carbon black, carbon nanotube, black pigments, colored glass frit, and the like. In this case, the composition of the paste may comprise 50 to 90 wt % of the electric conductive pattern material, 1 to 20 wt % of the organic binder, 1 to 10 wt % of the blackening material, 0.1 to 10 wt % of the glass frit, and 1 to 20 wt % of the solvent.

When the blackening treatment is performed after the sintering, the composition of the paste may comprise 50 to 90 wt % of the electric conductive pattern material, 1 to 20 wt % of the organic binder, 0.1 to 10 wt % of the glass frit, and 1 to 20 wt % of the solvent. The blackening treatment after the sintering comprises dipping into the oxidized solution, for example, the solution comprising the Fe or Cu ion, dipping into the solution comprising a halogen ion such as a chlorine ion, dipping into hydrogen peroxides and nitric acids, treatment using the halogen gas, and the like.

According to the exemplary embodiment of the present invention, manufacturing may be performed by dispersing the electric conductive pattern material, the organic binder, and the glass frit in the solvent. Specifically, the organic binder resin solution is manufactured by dissolving the organic binder in the solvent, the glass frit is added thereto, the aforementioned metal powder as the conductive material is finally added thereto, the solution is kneaded, and the metal powder and the glass frit that are agglomerated are uniformly dispersed by using the three stage roll mill. However, the present invention is not limited to the aforementioned method.

Further, the present invention provides a method of manufacturing a transparent conductive substrate, comprising: forming a conductive pattern on a transparent substrate, wherein the conductive pattern comprises line breakage portions performing electric breakage, and a pattern of a broken line formed when the line breakage portions are connected is formed to comprise an irregular pattern shape.

In the present invention, after the desired pattern form is determined first, the precise conductive pattern having the small line width may be formed on the transparent substrate by using a printing method, a photolithography method, a photography method, a method using a mask, a sputtering method, an inkjet method, or the like. When the pattern form is determined, a Voronoi diagram generator may be used, such that a complex pattern form may be easily determined. Herein, the Voronoi diagram generator means dots disposed so that the Voronoi diagram can be formed as described above. However, the scope of the present invention is not limited thereto, and another method may be used when the desired pattern form is determined.

The printing method may be performed by using a method in which the paste comprising the electric conductive pattern material is transferred on the transparent substrate in the desired pattern form and then sintered.

The transferring method is not particularly limited, but the aforementioned pattern form may be formed on a pattern transferring medium such as an intaglio or a screen and the desired pattern may be transferred on the transparent substrate by using the pattern form. The method of forming the pattern form on the pattern transferring medium may be performed by using a method known in the art.

The printing method is not particularly limited, and a printing method such as offset printing, screen printing, gravure printing, flexo printing, and inkjet printing may be used, and one or more complex methods among the methods may be used. The printing method may adopt a roll to roll method, roll to plate, plate to roll, or plate to plate method.

The offset printing may be performed by using the method in which after the paste is filled in the intaglio on which the pattern is formed, first transferring is performed by using silicon rubber called the blanket, and the second transferring is performed by bringing the blanket into close contact with the transparent substrate. The screen printing may be performed by using the method in which after the paste is disposed on the screen on which the pattern is formed, the paste is directly provided on the substrate through the screen having the space while pushing the squeeze. The gravure printing may be performed by using the method in which after the paste is filled in the pattern while winding the blanket where the pattern is formed on the roll, the paste is transferred on the transparent substrate. In the present invention, the aforementioned methods may be used, and the aforementioned methods may be used in combination. In addition, other printing methods known to the person with ordinary skill in the art may be used.

In the case of the offset printing method, since most of the paste is transferred on the transparent substrate such as glass because of a release property of the blanket, a separate blanket washing process is not required. The intaglio may be manufactured by precisely etching the glass on which the desired electric conductive pattern is formed, and metal or DLC (diamond-like carbon) coating may be performed on the glass surface for durability. The intaglio may be manufactured by etching the metal plate.

In the present invention, it is preferable to use the offset printing method in order to implement the more precise conductive pattern. After the paste is filled in the pattern of the intaglio by using the doctor blade as the first step, the first transferring is performed by rotating the blanket, and the second transferring is performed on the surface of the transparent substrate by rotating the blanket as the second step.

In the present invention, the printing method is not limited to the aforementioned printing methods, and the photolithography process may be used. For example, the photolithography process may be performed by using the method in which the conductive pattern material layer is formed on the entire surface of the transparent substrate, the photoresist layer is formed thereon, the photoresist layer is patterned by the selective exposure and developing processes, the conductive pattern is patterned by using the patterned photoresist layer as the mask, and the photoresist layer is removed.

Further, the present invention may adopt the photolithography method. For example, after the picture photosensitive material comprising silver halide is applied on the transparent substrate, the pattern may be formed by selective exposing and developing processes of the photosensitive material. A detailed example will be described below. First, the photosensitive material for negative is applied on the substrate on which the pattern will be formed. In this case, a polymer film such as PET and acetyl celluloid may be used as the substrate. The polymer film material on which the photosensitive material is applied is called the film herein. The photosensitive material for negative may be formed of silver halide in which AgBr that is very sensitive to light and regularly reacted therewith and a small amount of AgI were mixed with each other. Since the image developed by picturing the general photosensitive material for negative is a negative picture that is opposite to the subject in terms of light and shade, the picturing may be performed by using the mask having the pattern form that will be formed and preferably irregular pattern shape.

Plating treatment may be further performed in order to increase conductivity of the conductive pattern formed by using the photolithography and photography processes. The plating may adopt an electroless plating method, copper or nickel may be used as the plating material, and after copper plating is performed, nickel plating may be performed thereon, but the scope of the present invention is not limited thereto.

Further, the present invention may adopt the method using the mask. For example, the patterning may be performed by depositing the conductive pattern material on the substrate after the mask having the desired conductive pattern form is disposed to be close to the substrate.

In this case, the depositing method may adopt a heat deposition method by heat or electron beam, a PVD (physical vapor deposition) method such as sputter, and a CVD (chemical vapor deposition) method using an organometal material.

In the present invention, in the case where the aforementioned paste is used, if the paste is sintered after being printed by the aforementioned pattern, the pattern having electric conductivity is formed. In this case, the sintering temperature is not particularly limited, but may be 400 to 800° C. and preferably 600 to 700° C. In the case where the transparent substrate forming the electric conductive pattern is glass, if necessary, the glass may be shaped for the purpose in the sintering step. In addition, in the case where the plastic substrate or film is used as the transparent substrate forming the electric conductive pattern, it is preferable that the sintering be performed at relatively low temperatures. For example, the sintering may be performed at 50 to 350° C.

Further, the present invention provides a capacitive type touch screen apparatus comprising the transparent conductive substrate.

The capacitance type touch screen apparatus comprising the transparent conductive substrate according to the present invention can minimize a moiré phenomenon and a diffraction phenomenon by external light.

MODE FOR INVENTION

Hereinafter, the present invention will be described in detail with reference to the Examples. However, the following Examples are set forth to illustrate the present invention, but the scope of the present invention is not limited thereto.

Example

In order to avoid the moiré by the line breakage, the line breakage was performed by using the Voronoi pattern of the design pitch of 1,000 μm to electrically insulate the 4 μm mesh region having the pitch of 300 μm, and in this case, the width of the broken line was defined by 10 μm.

Figure 6:
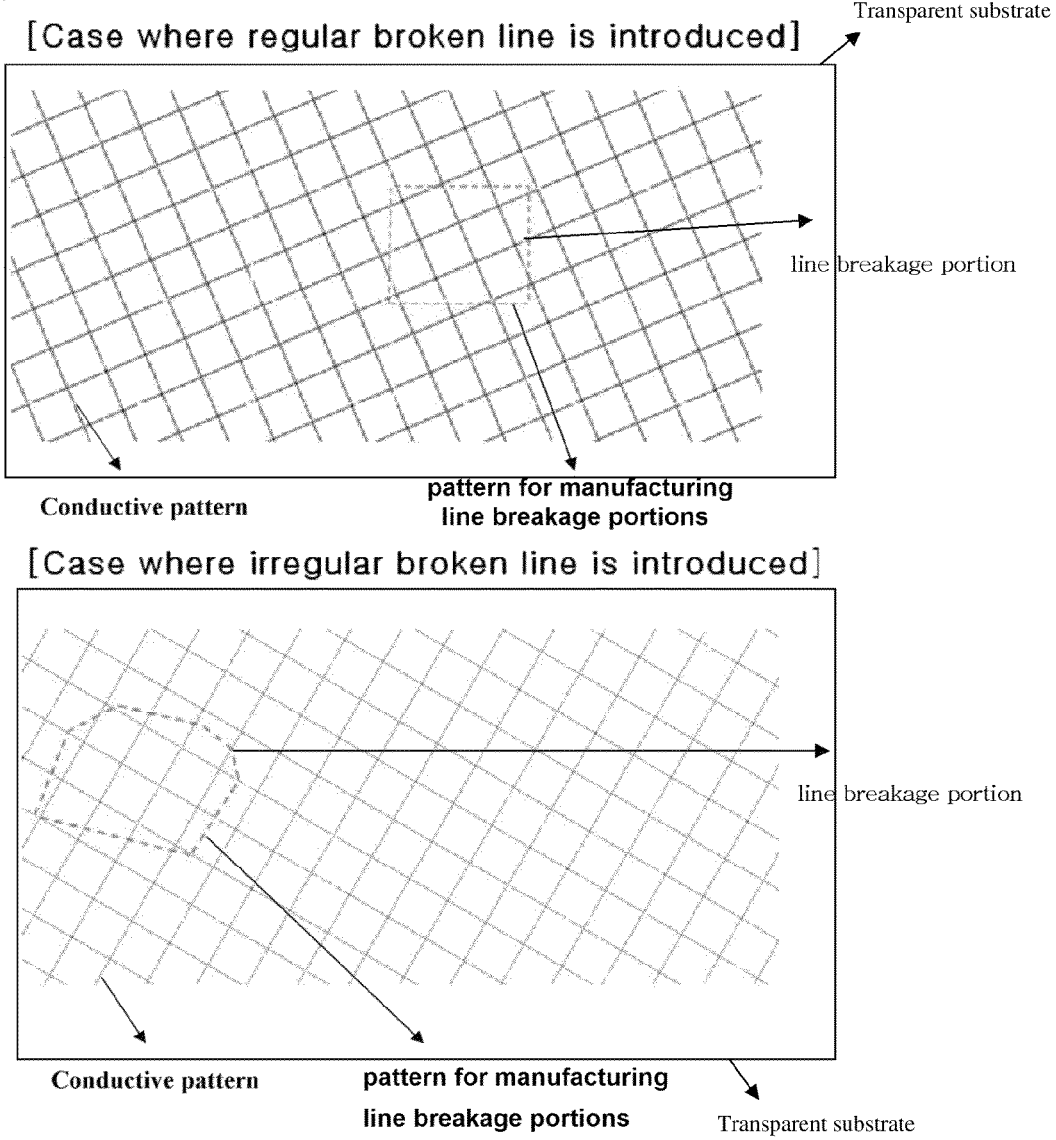
FIG. 6 is a view showing the conductive pattern in the case where a regular broken line is introduced and in the case where an irregular broken line is introduced as the exemplary embodiment of the present invention.

The conductive patterns in the case where the line breakage is performed by using the Voronoi pattern as the case where the irregular broken line is introduced and in the case where a known regular line breakage is introduced are shown in the following FIG. 6.

As described above, a transparent conductive substrate comprising a conductive pattern according to the present invention can minimize a moiré phenomenon and a diffraction phenomenon by external light by performing line breakage of a regular or irregular conductive pattern by using the irregular pattern.

The invention claimed is:

1. A transparent conductive substrate comprising:
a transparent substrate, and
a conductive pattern provided on the transparent substrate, wherein the conductive pattern comprises line breakage portions,
a pattern for manufacturing the line breakage portions comprises an irregular pattern shape,
the irregular pattern shape comprises an edge structure of continuously connected closed figures, and
a number of vertexes of the closed figures is different from the number of vertexes of a same number of quadrangles as the closed figures; the number of vertexes of the closed figures is different from the number of vertexes of a polygon formed by connecting shortest distances between centers of gravity of the closed figures; or a value of the following Equation 1 is 50 or more in the closed figures:

(Standard deviation of distances between vertexes/ Average of distances between vertexes)×100.    [Equation 1]

2. The transparent conductive substrate of claim 1, wherein the conductive pattern comprises a pattern formed of a conductive metal line.

3. The transparent conductive substrate of claim 2, wherein the line breakage portions electrically break the conductive metal line, and an interval between the electrically broken conductive metal lines is 50 μm or less.

4. The transparent conductive substrate of claim 3, wherein the interval between the electrically broken conductive metal lines is 0.5 to 15 μm.

5. The transparent conductive substrate of claim 2, wherein the pattern formed of the conductive metal line comprises a straight line, a curved line, or a closed curve formed of the straight line and the curved line.

6. The transparent conductive substrate of claim 1, wherein the conductive pattern is a regular or irregular pattern.

7. The transparent conductive substrate of claim 1, wherein the conductive pattern comprises a mesh pattern.

8. The transparent conductive substrate of claim 7, wherein the mesh pattern comprises a regular polygonal pattern comprising one or more shapes of a triangle, a quadrangle, a pentagon, a hexagon, and an octagon.

9. The transparent conductive substrate of claim 1, wherein the conductive pattern comprises an edge structure of continuously connected closed figures, the closed figures having the same shape are not present in a predetermined unit area (1 cm×1 cm) in the conductive pattern, and the number of vertexes of the closed figures is different from the number of vertexes of quadrangles having the same number as the closed figures.

10. The transparent conductive substrate of claim 1, wherein the conductive pattern comprises an edge structure of continuously connected closed figures, the closed figures having the same shape are not present in the predetermined unit area (1 cm×1 cm) in the conductive pattern, and the number of vertexes of the closed figures is different from the number of vertexes of a polygon formed by connecting shortest distances between centers of gravity of the closed figures.

11. The transparent conductive substrate of claim 1, wherein the conductive pattern comprises an edge structure of continuously connected closed figures, the closed figures having the same shape are not present in the predetermined unit area (1 cm×1 cm) in the conductive pattern, and a value of the following Equation 1 is 50 or more in the closed figures:

(Standard deviation of distances between vertexes/ Average of distances between vertexes)×100.    [Equation 1]

12. A method of manufacturing a transparent conductive substrate, comprising:
forming a conductive pattern on a transparent substrate, wherein the conductive pattern comprises line breakage portions, a pattern for manufacturing the line breakage portions comprises an irregular pattern shape, the irregular pattern shape comprises an edge structure of continuously connected closed figures, and
wherein a number of vertexes of the closed figures is different from the number of vertexes of a same number of quadrangles as the closed figures; the number of vertexes of the closed figures is different from the number of vertexes of a polygon formed by connecting shortest distances between centers of gravity of the closed figures; or a value of the following Equation 1 is 50 or more in the closed figures:

(Standard deviation of distances between vertexes/ Average of distances between vertexes)×100.    [Equation 1]

13. A capacitive type touch screen apparatus comprising:
the transparent conductive substrate according to claim 1.

* * * * *